United States Patent
Reisner et al.

(10) Patent No.: US 9,660,609 B2
(45) Date of Patent: May 23, 2017

(54) DEVICES AND METHODS RELATED TO STACKED DUPLEXERS

(71) Applicant: SKYWORKS SOLUTIONS, INC., Woburn, MA (US)

(72) Inventors: Russ Alan Reisner, Oxnard, CA (US); John C. Baldwin, Tarzana, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/204,391

(22) Filed: Jul. 7, 2016

(65) Prior Publication Data

US 2017/0012603 A1  Jan. 12, 2017

Related U.S. Application Data

(60) Provisional application No. 62/189,689, filed on Jul. 7, 2015.

(51) Int. Cl.

| | | |
|---|---|---|
| *H01L 23/31* | (2006.01) | |
| *H03H 9/05* | (2006.01) | |
| *H01L 23/552* | (2006.01) | |
| *H01L 25/065* | (2006.01) | |
| *H01L 23/66* | (2006.01) | |
| *H01L 23/498* | (2006.01) | |
| *H03H 9/46* | (2006.01) | |
| *H04B 1/04* | (2006.01) | |
| *H04B 1/16* | (2006.01) | |

(52) U.S. Cl.
CPC ....... *H03H 9/0566* (2013.01); *H01L 23/3114* (2013.01); *H01L 23/49838* (2013.01); *H01L 23/552* (2013.01); *H01L 23/66* (2013.01); *H01L 25/0657* (2013.01); *H03H 9/46* (2013.01); *H01L 2225/0651* (2013.01); *H01L 2225/06517* (2013.01); *H01L 2225/06555* (2013.01); *H04B 1/04* (2013.01); *H04B 1/16* (2013.01)

(58) Field of Classification Search
CPC .. H03H 9/0566; H03H 9/46; H01L 23/49838; H01L 23/552; H01L 25/0657; H01L 23/66; H01L 23/3114; H01L 2225/06555; H01L 2225/0651; H01L 2225/06517; H04B 1/04; H04B 1/16
See application file for complete search history.

(56) References Cited

U.S. PATENT DOCUMENTS 8,102,032 B1 *  1/2012  Bolognia ............ H01L 23/3128
257/659

* cited by examiner

*Primary Examiner* — Roy Potter
*Assistant Examiner* — Paul Patton
(74) *Attorney, Agent, or Firm* — Chang & Hale LLP; Tony T. Chen; James Chang

(57) ABSTRACT

Devices and method related to stacked duplexers. In some embodiments, an assembly may include a first wafer-level packaging (WLP) device having a radio-frequency (RF) shield. The assembly may also include a second WLP device having an RF shield, the second WLP device positioned over the first WLP device such that the RF shield of the second WLP device is electrically connected to the RF shield of the first WLP device.

20 Claims, 12 Drawing Sheets

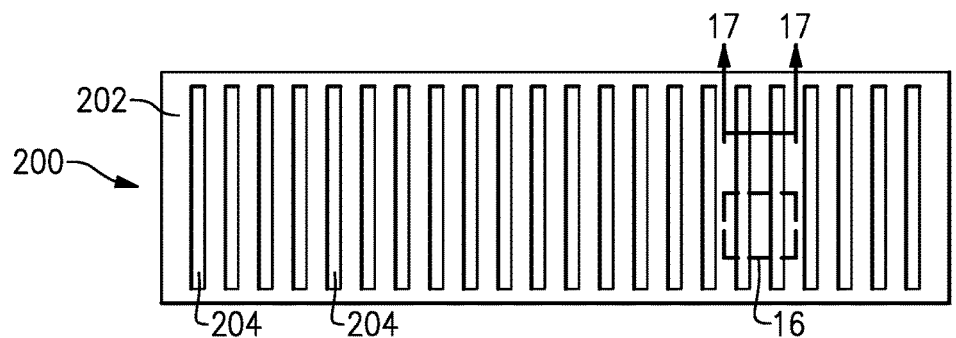
FIG.15
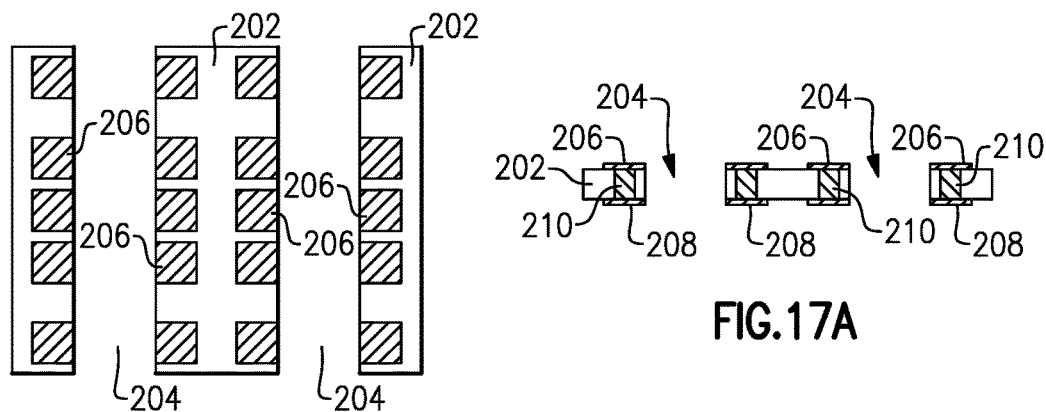
FIG.16A
FIG.17A
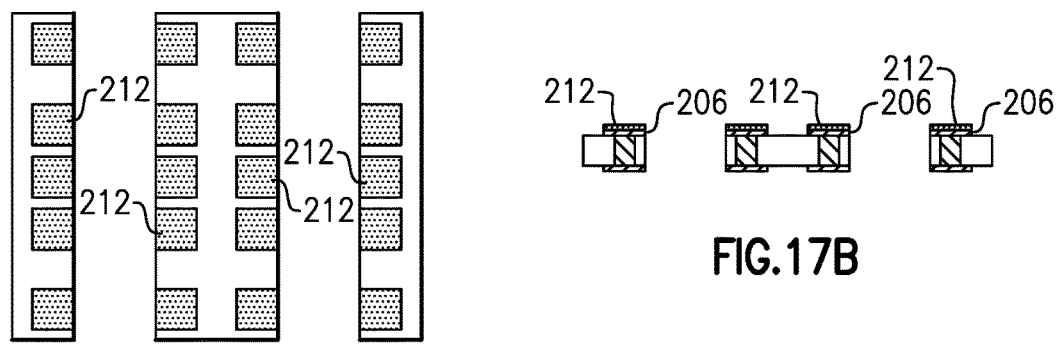
FIG.16B
FIG.17B

DEVICES AND METHODS RELATED TO STACKED DUPLEXERS

CROSS-REFERENCE TO RELATED APPLICATION(S)

This application claims priority to U.S. Provisional Application No. 62/189,689 filed Jul. 7, 2015, entitled "DEVICES AND METHODS RELATED TO STACKED DUPLEXERS," the disclosure of which is hereby expressly incorporated by reference herein in its respective entirety.

BACKGROUND

Field

The present disclosure relates to multiplexers for radio-frequency (RF) applications.

Description of the Related Art

In some radio-frequency (RF) applications such as wireless applications, two or more RF signals can be multiplexed together to allow routing of such signals through a common path. Combining of two RF signals is typically referred to as diplexing; combining of three RF signals is typically referred to as triplexing; and so on.

SUMMARY

In some implementations, the present disclosure relates to an assembly. The assembly includes a first wafer-level packaging (WLP) device having a radio-frequency (RF) shield. The assembly also includes a second WLP device having an RF shield, the second WLP device positioned over the first WLP device such that the RF shield of the second WLP device is electrically connected to the RF shield of the first WLP device.

In some embodiments, the first WLP device includes a first RF filter, and the second WLP device includes a second RF filter.

In some embodiments, each of the first and second RF filters includes a grounding contact pad, at least one input contact pad, and at least one output contact pad.

In some embodiments, the RF shield of each of the first and second RF filters includes a conformal coating of conductive material.

In some embodiments, the conformal coating of each RF filter is electrically connected to the corresponding grounding contact pad.

In some embodiments, the second RF filter is in an inverted orientation such that the conformal coating of the RF second filter is in electrical contact with the conformal coating of the first RF filter.

In some embodiments, the conformal coating of the second RF filter is electrically connectable to an external ground node through the grounding contact pad of the first RF filter.

In some embodiments, the first RF filter has a first lateral dimension and the second RF filter has a second lateral dimension that is greater than the first lateral dimension such that each of a plurality of edges of the second RF filter forms an overhang over a corresponding edge of the first RF filter.

In some embodiments, the second RF filter is in an upright orientation, and some or all of the grounding contact pad, the at least one input contact pad, and the at least one output contact pad are located at the overhanging edges.

In some embodiments, the assembly further includes a plurality of mounting structures configured to allow mounting of the second RF filter to a packaging substrate at locations that are laterally offset beyond the corresponding edges of the first RF filter.

In some embodiments, at least some of the mounting structures is configured to provide one or more electrical connections between the second RF filter and the packaging substrate.

In some embodiments, the one or more electrical connections between the second RF filter and the packaging substrate includes a grounding connection between the grounding contact pad of the second RF filter and a ground on the packaging substrate.

In some embodiments, the mounting structures include a printed circuit board (PCB) implemented on each of two opposing sides of the first RF filter, the PCB having a thickness selected to allow the second RF filter to be positioned over the first RF filter.

In some embodiments, the mounting structures include a ball-grid array (BGA) implemented on each of two opposing sides of the first RF filter, the BGA dimensioned to allow the second RF filter to be positioned over the first RF filter.

In some embodiments, the mounting structures include a ball-grid array (BGA) and a printed circuit board (PCB) implemented on each of two opposing sides of the first RF filter, the BGA and the PCB dimensioned to allow the second RF filter to be positioned over the first RF filter.

In some embodiments, the mounting structures include an interposer structure implemented on each of two opposing sides of the first RF filter, the interposer structure dimensioned to allow the second RF filter to be positioned over the first RF filter.

In some embodiments, the first RF filter is configured to provide receive (RX) filtering functionality for one or more RX frequency bands.

In some embodiments, the second RF filter is configured to provide transmit (TX) filtering functionality for one or more TX frequency bands.

In some embodiments, the first and second RF filters are configured to provide duplexer functionality for the corresponding one or more frequency bands.

In some embodiments, each of the first and second RF filters is configured to provide dual-band filtering capability.

In some embodiments, each of the first and second RF filters includes a surface acoustic wave (SAW) filter or a bulk acoustic wave (BAW) filter.

In some implementations, the present disclosure relates to radio-frequency (RF) module. The RF module includes a packaging substrate configured to receive a plurality of components. The RF module also includes a stacked assembly implemented on the packaging substrate, the stacked assembly including a first wafer-level packaging (WLP) device having a radio-frequency (RF) shield, the stacked assembly further including a second WLP device having an RF shield, the second WLP device positioned over the first WLP device such that the RF shield of the second In some embodiments, the RF module is a front-end module (FEM).

In some embodiments, the stacked assembly is configured as a duplexer, such that the first WLP device includes a first RF filter and the second WLP device includes a second RF filter.

In some implementations, the present disclosure relates to a wireless device. The wireless device includes a transceiver configured to generate a radio-frequency (RF) signal. The wireless device also includes a front-end module (FEM) in communication with the transceiver, the FEM including a packaging substrate configured to receive a plurality of components, the FEM further including a stacked assembly implemented on the packaging substrate, the stacked assembly including a first wafer-level packaging (WLP) device having a radio-frequency (RF) shield, the stacked assembly further including a second WLP device having an RF shield, the second WLP device positioned over the first WLP device such that the RF shield of the second WLP device is electrically connected to the RF shield of the first WLP device. The wireless device further includes an antenna in communication with the FEM, the antenna configured to transmit the amplified RF signal.

In some implementations, the present disclosure relates to a radio-frequency (RF) device. The RF device includes a packaging substrate configured to receive a plurality of components, the packaging substrate including a first side and a second side. The RF device also includes a first wafer-level packaging (WLP) device implemented on the first side of the packaging substrate. The RF device further includes a ball-grid array (BGA) implemented on the second side of the packaging substrate, the BGA defining a mounting volume on the second side of the packaging substrate. The RF device further includes a second WLP device implemented within the mounting volume.

BRIEF DESCRIPTION OF THE DRAWINGS

FIG. 15 shows an example panel, in accordance with some embodiments of the present disclosure.

FIGS. 16A-16D show example plan views of a panel, in accordance with some embodiments of the present disclosure.

FIGS. 17A-17D show example side sectional views of a panel, in accordance with some embodiments of the present disclosure.

DETAILED DESCRIPTION OF SOME EMBODIMENTS

The headings provided herein, if any, are for convenience only and do not necessarily affect the scope or meaning of the claimed invention.

In radio-frequency (RF) applications, duplexers typically occupy the most or substantial amount of space in packaged modules. To significantly reduce module sizes, duplexer sizes and/or volumes can be reduced. Some duplexer size reduction approaches rely on shrinking filter die and packaging sizes (e.g., wafer-level packaging (WLP)). However, it may not be possible achieve further size reductions using these approaches.

Figure 1:
FIG. 1 shows an example of a plurality of wafer-level packaging (WLP) devices, in accordance with some embodiments of the present disclosure.

FIG. 1 depicts a device or an assembly 100 in which a plurality of WLP devices are arranged in a stack configuration. Although various examples are described herein in the context of two of such devices being stacked, it will be understood that one or more features of the present disclosure can also be implemented in configurations having more than two devices.

For the purpose of description, it will be understood that the stack configuration of FIG. 1 can include the upper WLP (WLP 1 in FIG. 1) being in physical contact with the lower WLP (WLP 2 in FIG. 1) (e.g., directly or through an intermediate layer). The stack configuration of FIG. 1 can also include a configuration in which the upper WLP is not mounted on the lower WLP; accordingly, there may or may not be a gap between the two WLPs.

Figure 2:
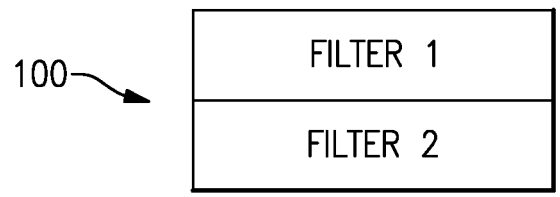
FIG. 2 shows an example of a filter, in accordance with some embodiments of the present disclosure.

FIG. 2 shows that in some embodiments, the WLPs of FIG. 1 can be RF filter devices implemented as a stacked device 100. Although various examples are described herein in the context of such filters or filter-based devices, it will be understood that one or more features of the present disclosure can also be implemented with WLPs other than filters or filter-based devices. It will also be understood that one or more features of the present disclosure can be implemented in stacked configurations having a filter device and a non-filter device.

For the purpose of description herein, it will be understood filters can include, for example, filtering circuits implemented on die, and filter devices such as surface acoustic wave (SAW) filters and bulk acoustic wave (BAW). It will also be understood that filters can include, and/or be referred to interchangeably with, related devices such as duplexers.

Figure 3:
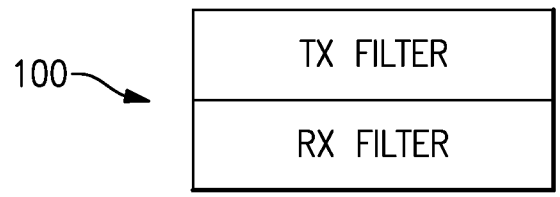
FIG. 3 shows an example of a duplexer, in accordance with some embodiments of the present disclosure.

FIG. 3 shows an example of a duplexer 100 that can be a more specific example of the stacked device 100 of FIG. 2. In the example of FIG. 3, a transmit (TX) filter is shown to be stacked over a receive (RX) filter. As described herein, such an RX filter can be mounted on a circuit board or a packaging substrate, and the TX filter can be mounted on the RX filter or be positioned over the RX filter without necessarily being mounted on the RX filter.

In the example of FIG. 3, each of the RX and TX filters can be configured to provide filtering functionality for one or more frequency bands. For example, the RX filter can be an RX dual mode SAW (DMS) filter configured to provide filtering functionality for two RX frequency bands, and the TX filter can be a ladder filter configured to provide filtering functionality for the two corresponding TX frequency bands. It will be understood that the RX filter and the TX filter do not necessarily need to have one-to-one correspondence between their respective frequency bands.

In some embodiments, it can be desirable to position the RX DMS filter on the bottom or lower portion of the duplexer 100 to, for example, yield as little ground inductance as possible. TX ladder filters can tolerate ground inductance better; and can actually benefit from the ground inductance to, for example, create harmonic notches. Accordingly, it can be desirable to position the TX latter filter in the example of FIG. 3 over the RX DMS filter.

Figure 4:
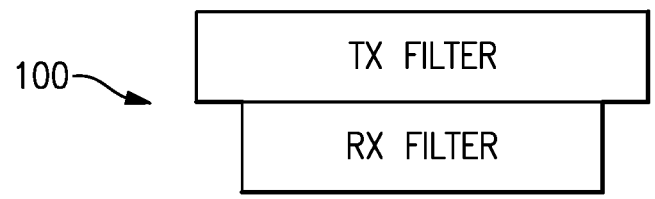
FIG. 4 shows an example of a filter, in accordance with some embodiments of the present disclosure.

In the example of FIG. 3, the RX filter and the TX filter are generally depicted as having similar lateral dimensions. In some embodiments, RX DMS filters are typically smaller than TX ladder filters. FIG. 4 shows an example configuration in which an upper TX ladder filter has a larger lateral dimension than that of a lower RX DMS filter. In some embodiments, such a TX ladder filter can be mounted on the smaller RX DMS filter. In some embodiments, overhangs resulting from the larger dimensioned TX ladder filter can be utilized to provide mounting and/or electrical connection functionalities without necessarily having to rely on the RX DMS filter.

Figure 5:
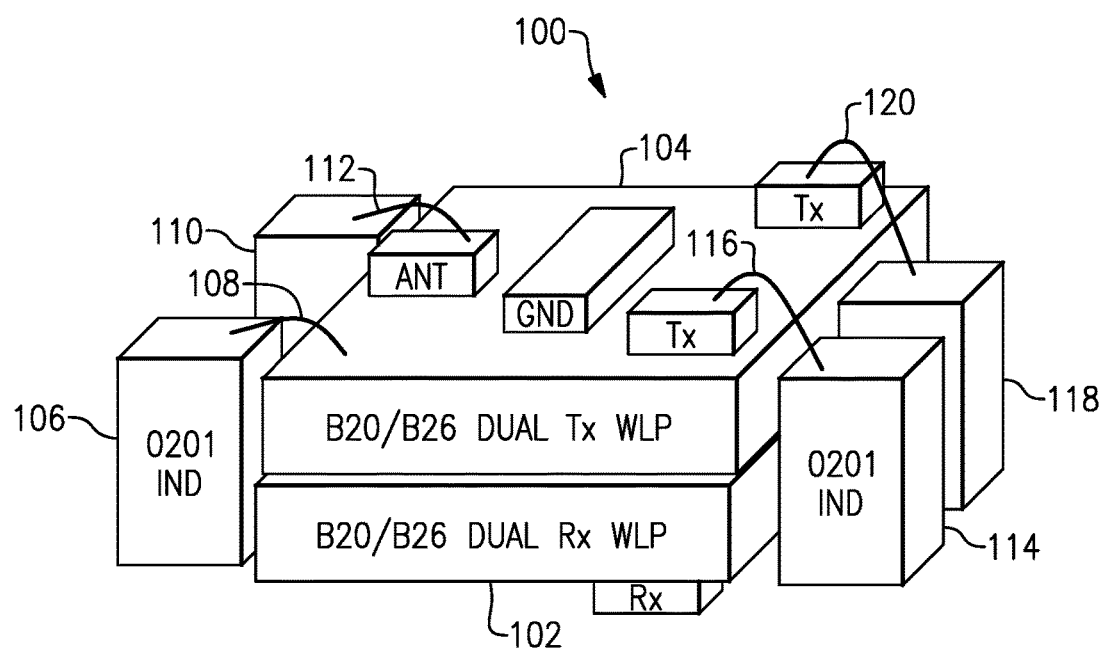
FIG. 5 shows an example of a duplexer, in accordance with some embodiments of the present disclosure.

FIG. 5 shows an example of a duplexer 100 having an RX WLP device 102, and a TX WLP device 104 stacked thereon. The RX WLP device 102 is depicted to provide dual band functionality for example RX bands B20 and B26. Similarly, the TX WLP device 104 is depicted to provide dual band functionality for example TX bands B20 and B26. It will be understood that other bands can be implemented, including non-limiting examples of frequency bands disclosed herein.

In the example of FIG. 5, the TX WLP device 104 is shown to be inverted so that its flat upper surface mounts on the flat upper surface of the RX WLP device 102. The lower surface of the TX WLP device 104 (now facing upward) is shown to include a plurality of contact pads, including a contact pad for an antenna output (Ant), a ground contact pad (Gnd), and contact pads (Tx) for input of the two bands. Similarly, the lower surface of the RX WLP device 102 can include a plurality of contact pads, including a contact pad for an antenna input (Ant), a ground contact pad (Gnd), and contact pads (Rx) for output of the two bands.

As further shown in FIG. 5, a plurality of SMT (surface-mount technology) devices such as inductors 106, 110, 114, 118 can be mounted on a circuit board or a packaging substrate, adjacent to the stacked duplexer 100. The example inductors are depicted as having 0201 SMT form factors; however, it will be understood that other form factors can also be utilized. It will also be understood that other types of SMT devices can also be implemented in a similar manner. Such SMT devices can be selected and configured to provide, for example, matching functionality.

In the example of FIG. 5, the contact pads of the TX WLP device 104 can be electrically connected to respective locations by, for example wirebonds. For example, the antenna (Ant) contact pad is shown to be connected to the inductor 110 through a wirebond 112, and the Tx input contact pads are shown to be connected to their respective inductors 114, 118 through wirebonds 116, 120. In another example, a wirebond 108 is shown to electrically connect the inductor 106 to ground through a conductive coating which is in turn electrically connected to the ground contact pad (Gnd). In some embodiments, such a conductive coating can be configured to provide, for example, shielding functionality for the TX WLP device 104. Additional details concerning such a conductive coating are described herein.

In the example of FIG. 5, the contact pads of the RX WLP device 102 can be utilized to mount the RX WLP device 102, and thus the duplexer 100, to a circuit board or a packaging substrate. In some embodiments, a conductive coating can be provide on the RX WLP device 102, and such a conductive coating can be configured to provide, for example, shielding functionality for the RX WLP device 102, and/or a conductive path between the conductive coating of the TX WLP device 104 and a ground plane of the circuit board. Additional details concerning such a conductive coating are described herein.

Figure 6:
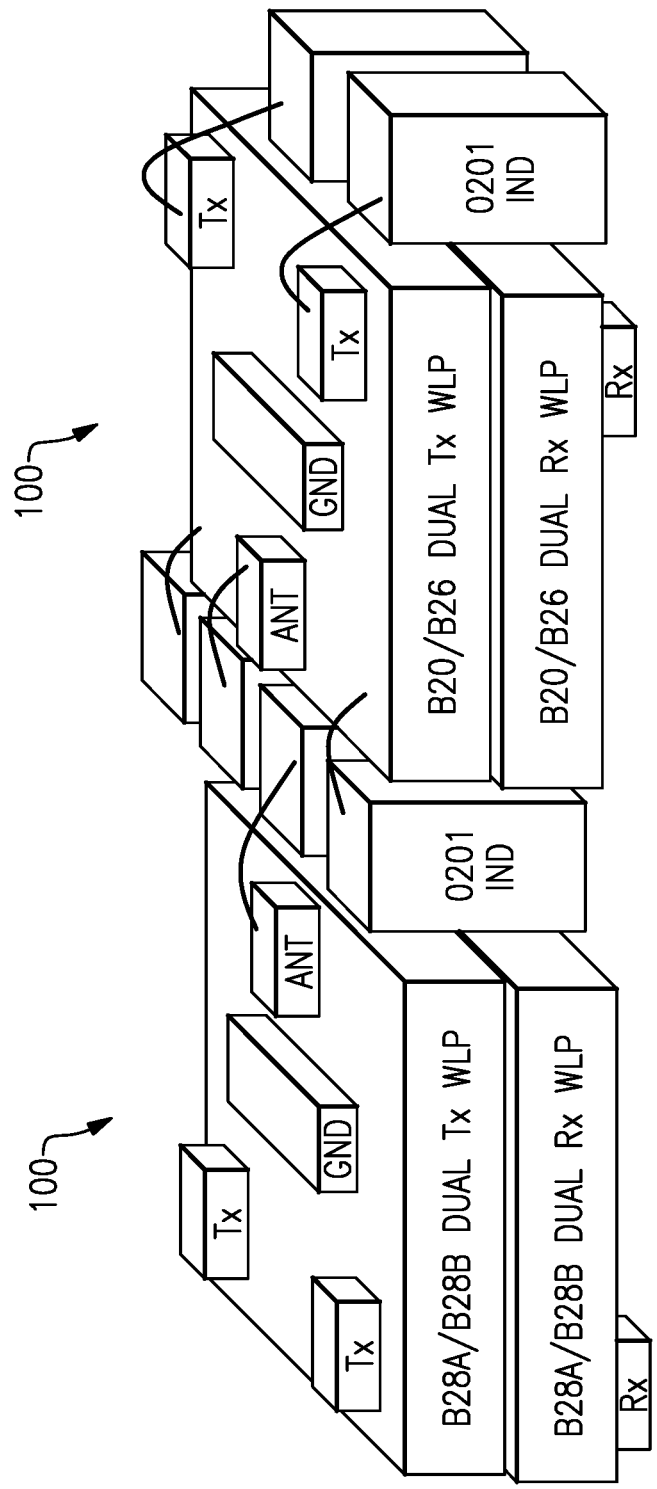
FIG. 6 shows an example of a plurality of duplexers, in accordance with some embodiments of the present disclosure.

FIG. 6 shows an example configuration where a plurality of duplexers 100 are shown to be implemented with a pluality of SMTs. Each of the two example duplexers 100 is shown be include a stack having a dual TX WLP device implemented over a dual RX WLP device in a manner similar to the example of FIG. 5. The example duplexer 100 on the right side is depicted as being configured to provide dual band duplexing functionality for example bands B20 and B26. The example duplexer 100 on the left side is depicted as being configured to provide dual band duplexing functionality for example bands B28A and B28B. Again, it will be understood that other bands can be implemented, including non-limiting examples of frequency bands disclosed herein.

In one embodiment, the filters, duplexers, and/or WLPs described herein may be part of a dual-sided package. The dual sided package may be an RF package. The RF package may include a filter, duplexer, and/or a WLP on a first side (e.g., a top side) and may include a a filter, duplexer, and/or a WLP on a second side (e.g., a bottom side). The dual-sided package may also include mounting features and/or support structures on one side of the dual-sided package (e.g., the bottom side). For example, the dual-sided package may include a ball-grid array (BGA) on one side of the dual-sided package. The mounting features and/or support structures may form/define a mounting volume on one side of the dual-sided package (e.g., on the bottom side). One or more filters, duplexers, and/or WLPs may be located within the mounting volume (formed/defined by the mounting features/support structures). Examples of dual-sided packages that may be used herein (e.g., dual-sided packages that may include filters, duplexers, WLPs, etc.) are described in U.S. Provisional Application No. 62/031,815, filed on Jul. 31, 2014, titled "DUAL-SIDED RADIO-FREQUENCY PACKAGE HAVING BALL GRID ARRAY," and in U.S. patent application Ser. No. 14/815,426, filed on Jul. 31, 2015, titled "DUAL-SIDED RADIO-FREQUENCY PACKAGE HAVING BALL GRID ARRAY." The contents of each of the above-referenced applications are hereby expressly incorporated by reference herein in their entireties.

Figure 7A:
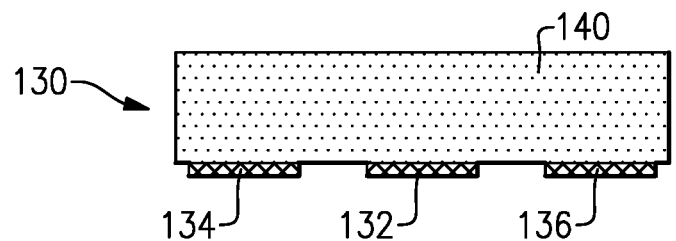
FIGS. 7A-7C, show examples of a WLP device, in accordance with some embodiments of the present disclosure.
Figure 7B:
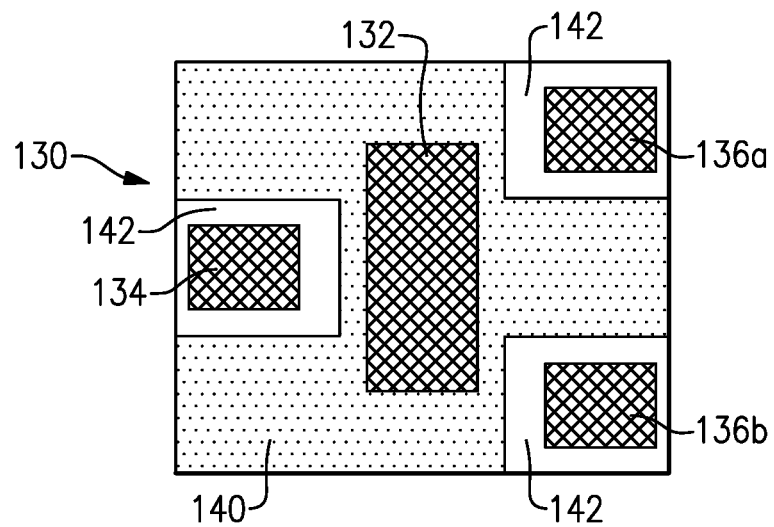
Figure 7C:
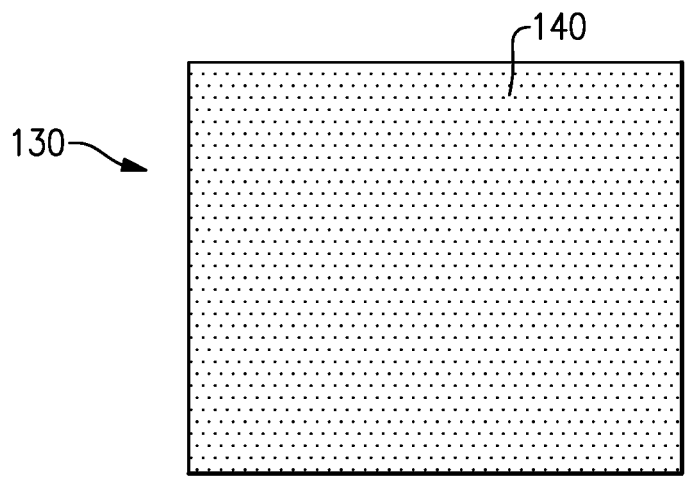
Figure 8A:
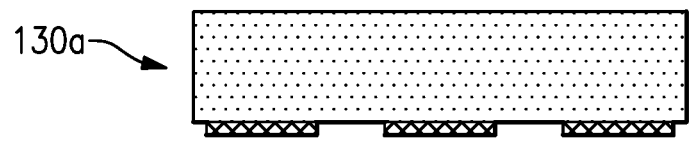
FIGS. 8A-8C show an examples WLP devices, in accordance with some embodiments of the present disclosure.
Figure 8B:
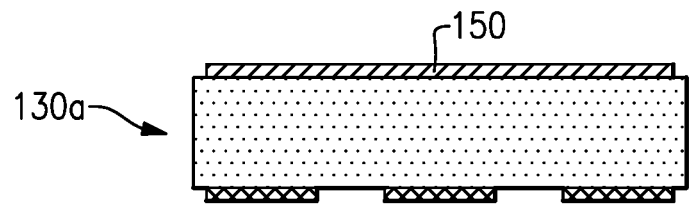
Figure 8C:
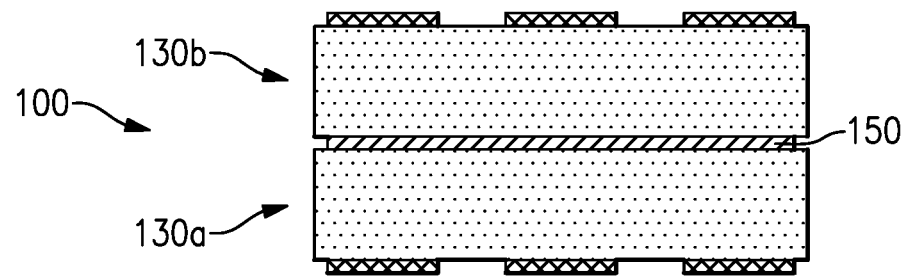
Figure 9A:
FIGS. 9A-9C show an example a stacked duplexer, in accordance with some embodiments of the present disclosure.
Figure 9B:
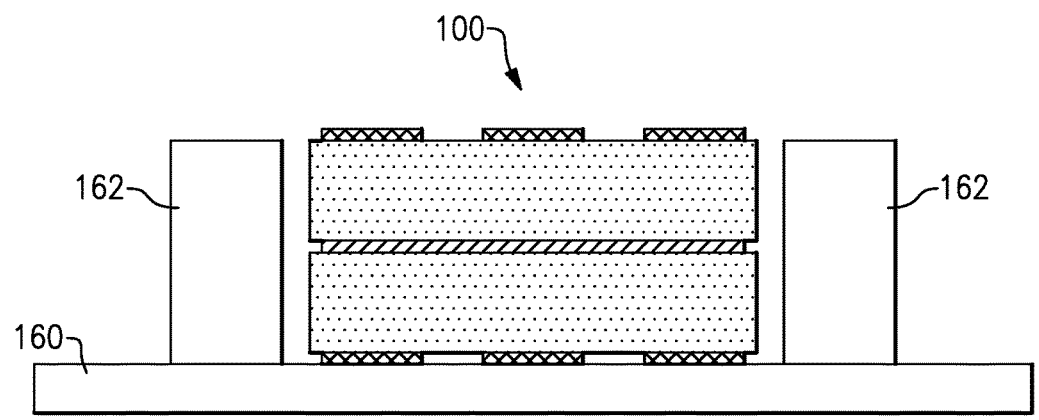
Figure 9C:
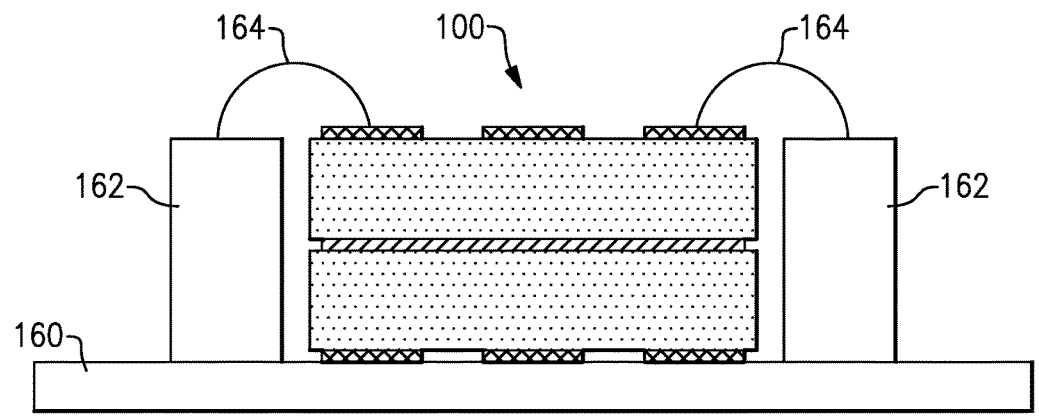

FIGS. 7A-7C show an example of how a WLP can be configured to provide shielding functionality and/or grounding-path functionality in duplexers such as the examples of FIGS. 5 and 6. FIGS. 8A-8C show an example of how such WLPs can be combined to form duplexers such as the examples of FIGS. 5 and 6. FIGS. 9A-9C show an example of how such duplexers can be mounted on a circuit board or a packaging substrate.

Referring to FIGS. 7A-7C, a WLP device 130 can be a filter or a filter-based device such as the TX and RX duplexers of FIGS. 5 and 6. Such a WLP device can include a conductive coating 140 such as a conformally coated conductive layer. In some embodiments, such a conductive coating can cover some of all of the upper surface (FIG. 7C), some or all of the side walls (FIG. 7A), and selected portions of the lower surface (FIG. 7B). The coated upper surface 140 can be electrically connected to the coated lower surface 140 of the WLP device 130 through the coated surface 140 of the side wall(s). The coated surface 140 of the lower surface can be electrically connected to a grounding pad 132. The coated surface 140 of the lower surface can also be patterned so as to be electrically isolated from other non-grounding contact pads such as an antenna contact pad 134 and signal input/output contact pads 136a, 136b (e.g., TX input pads or RX output pads). Such electrical isolation between the coated surface 140 of the lower surface and the contact pads 134, 136a, 136b can be achieved by, for example, an appropriate patterning of the coated surface 140.

A WLP device configured in the foregoing manner can allow two such devices to be stacked in a manner described herein in reference to FIGS. 5 and 6, and have the conductive coating of each WLP device be electrically connected to a ground plane on or within a circuit board or a packaging substrate. More particularly, the conductive coating of the lower WLP device (e.g., the RX WLP device 102 in FIGS. 5 and 6) can be electrically connected to the ground plane through its grounding pad (Gnd in FIGS. 5 and 6, and 132 in FIG. 7B). The conductive coating of the upper WLP device (e.g., the TX WLP device 104 in FIGS. 5 and 6) can be electrically connected to the ground plane through the conductive coating of the lower WLP device (e.g., through an electrical contact between their two flat surfaces), and therefore through the grounding pad (Gnd in FIGS. 5 and 6, and 132 in FIG. 7B) of the lower WLP device.

FIGS. 8A-8C show an example of how two WLP devices 130a, 130b can be stacked so as to provide the foregoing electrical connection between the conductive coating of an upper WLP device 130b and the ground plane. Referring to FIG. 8A, a lower WLP device 130a can be formed or provided. As described herein, such a lower WLP device can be, for example, an RX WLP device. Referring to FIG. 8B, an electrically conductive mounting layer 150 (e.g., an electrically conductive adhesive) can be formed on the upper conductive surface of the lower WLP device 130a. Referring to FIG. 8C, the upper WLP device 130b can be inverted such that its conductive upper surface is facing downward, and such an upper WLP device 130b can be mounted on the electrically conductive mounting layer 150, so as to form a stacked duplexer 100. Accordingly, the conductive surface of the upper WLP device 130b can be electrically connected to the conductive surface of the lower WLP device 130a.

FIGS. 9A-9C show an example of how a stacked duplexer such as the example stacked duplexer 100 of FIG. 8C can be mounted on a circuit board or a packaging substrate. Referring to FIG. 9A, a circuit board 160 can have a number of SMT devices 162 mounted thereon. Such SMT devices can be, for example, inductors and/or other passive components described herein in reference to FIGS. 5 and 6. Referring to FIG. 9B, a stacked duplexer 100 can be mounted on the circuit board 160, within a designated area between or adjacent the SMT devices 162. Referring to FIG. 9C, electrical connections (e.g., wirebonds) can be formed between some or all of the SMT devices 162 and contact pads and/or conductive coating on the upward facing side of the upper WLP device of the stacked duplexer 100.

In the examples of FIGS. 7-9, the upper and lower WLP devices of the stacked duplexer 100 are depicted as having similar lateral dimensions. In such a situation, or when the upper WLP device has a smaller lateral dimension than the lower WLP device, a stacking configuration similar to the examples of FIGS. 7-9 (in which the upper device is mounted on and supported by the lower device) can be appropriate. However, when the upper WLP device has a larger lateral dimension than the lower WLP device, the overhang of the upper WLP device can allow implementation of other stacking configurations.

FIGS. 10-14 show non-limiting examples of stacked duplexers where upper WLP devices have larger lateral dimensions than the lower WLP devices. Accordingly, stacking configurations that utilize the overhangs of the upper WLP devices can also be implemented.

In each of the examples of FIGS. 10-14, a stacked duplexer 100 is shown to include a lower WLP device 130a mounted on a substrate 160 such as a printed circuit board (PCB) through the lower WLP device's contact pads 170. An upper WLP device 130b is shown to be positioned above the lower WLP device 130a by a corresponding supporting arrangement. Electrical connections for such an upper WLP device can be based on the supporting arrangement.

Figure 10:
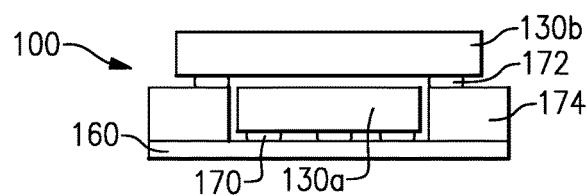
FIG. 10 shows an example of a duplexer, in accordance with some embodiments of the present disclosure.

In the example of FIG. 10, the lower WLP device 130a can be mounted within a deep cavity defined by, for example, a PCB. Accordingly, the portion indicated as 160 can be utilized to mount the lower WLP device 130a, and a portion indicated as 174 can be utilized to mount the upper WLP device 130b. Such mounting of, as well as electrical connections for the upper WLP device 130b can be facilitated by contact pads 170. In some embodiments, either or both of the lower and upper WLP devices 130a, 130b can be shielded by, for example, conformal coating of conductive material. Grounding of such a conductive conformal coating, if any, for each WLP device can be made through its respective grounding pad.

Figure 11:
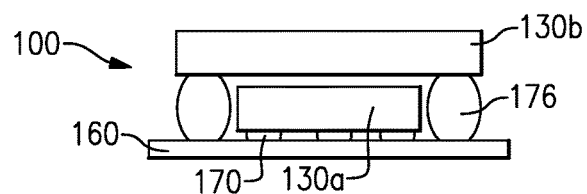
FIG. 11 shows an example of a duplexer, in accordance with some embodiments of the present disclosure.

In the example of FIG. 11, the lower WLP device 130a can be mounted on, for example, a PCB 160. The upper WLP device 130b can be mounted over the lower WLP device 130a by use of a relatively high ball grid array (BGA) 176. Such mounting of, as well as electrical connections for the upper WLP device 130b can be facilitated by contact pads (not shown in FIG. 11) and the BGA 176. In some embodiments, either or both of the lower and upper WLP devices 130a, 130b can be shielded by, for example, conformal coating of conductive material. Grounding of such a conductive conformal coating, if any, for each WLP device can be made through its respective grounding pad.

Figure 12:
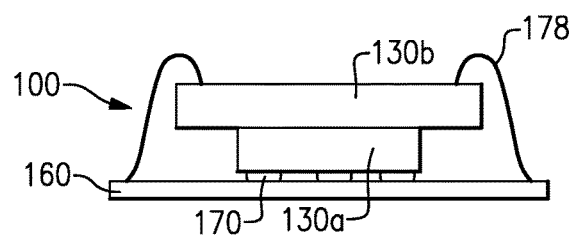
FIG. 12 shows an example of a duplexer, in accordance with some embodiments of the present disclosure.

In the example of FIG. 12, the lower WLP device 130a can be mounted on, for example, a PCB 160. The upper WLP device 130b can be mounted on the lower WLP device 130a in a manner similar to the examples of FIGS. 5 and 6. Such a mounting can be facilitated by the upper WLP device 130b being inverted so as to result in contact pads (not shown in FIG. 12) facing upward. Electrical connections for the upper WLP device 130b can be formed through, for example, wirebonds 176. In FIG. 12, such wirebonds are shown to be formed between the upper WLP device 130b and the PCB 160; however, as described herein, one or more wirebonds can be formed between the upper WLP device and one or more SMT devices such as inductors. In some embodiments, either or both of the lower and upper WLP devices 130a, 130b can be shielded by, for example, conformal coating of conductive material. Grounding of the conductive conformal coating for the upper WLP device 130b can be made through the conductive conformal coating for the lower WLP device 130a.

Figure 13:
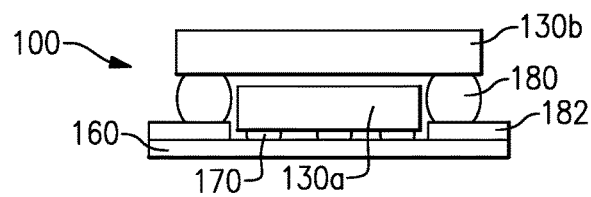
FIG. 13 shows an example of a duplexer, in accordance with some embodiments of the present disclosure.

FIG. 13 shows an example that can be a combination of the examples of FIGS. 10 and 11. More particularly, the lower WLP device 130a can be mounted within a shallow cavity defined by, for example, a PCB. Accordingly, the portion indicated as 160 can be utilized to mount the lower WLP device 130a, and a portion indicated as 182 can be utilized to form a BGA 180 to thereby allow mounting of the upper WLP device 130b over the lower WLP device 130a. Such mounting of, as well as electrical connections for the upper WLP device 130b can be facilitated by contact pads (not shown in FIG. 13) and the BGA 180. In some embodiments, either or both of the lower and upper WLP devices 130a, 130b can be shielded by, for example, conformal coating of conductive material. Grounding of such a conductive conformal coating, if any, for each WLP device can be made through its respective grounding pad.

Figure 14:
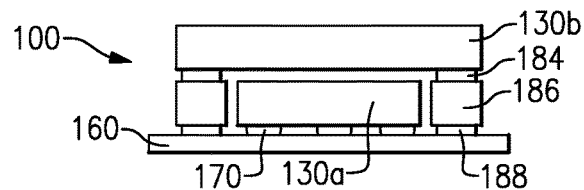
FIG. 14 shows an example of a duplexer, in accordance with some embodiments of the present disclosure.

FIG. 14 shows an example where the lower WLP device 130a can be mounted on, for example, a PCB 160, and the upper WLP device 130b can be mounted over the lower WLP device 130a with use of an interposer structure 186. Such mounting of, as well as electrical connections for the upper WLP device 130b can be facilitated by contact pads 184, the interposer structure 186, and contact pads 188. In some embodiments, either or both of the lower and upper WLP devices 130a, 130b can be shielded by, for example, conformal coating of conductive material. Grounding of such a conductive conformal coating, if any, for each WLP device can be made through its respective grounding pad.

In the foregoing example of FIG. 14, fabrication can be achieved in a simple and cost-effective manner. Examples related to various processes that can be implemented for such fabrication are described in reference to FIGS. 15-18. As described herein, such processes can allow the upper WLP device to be coupled to the interposer structure without having to perform mounting operations in a recessed area. Such an assembly of the upper WLP device and the interposer structure can then be mounted over the lower WLP device, again without having to perform mounting operations in a recessed area.

FIG. 15 shows a panel 200 that can be utilized to fabricate an array of assemblies of upper WLP devices and interposer structures. In some embodiments, the panel 200 can be, for example, a PCB 202 with a plurality of slots 204. As described herein, a portion of each slot can allow the corresponding upper WLP device to be position over the lower WLP device, with the interposer structure providing some or all of the height. Accordingly, each slot can be dimensioned sufficiently wide to allow positioning of the lower WLP device therein.

FIGS. 16A-16D show plan views of the indicated portion at various stages of fabrication. FIGS. 17A-17D show side sectional views of the indicated portion at the corresponding stages of FIGS. 16A-16D.

Referring to FIGS. 16A and 17A, contact pads 206 can be formed about each slot 204 on the first side of the PCB 202; and corresponding contact pads 208 can be formed on the second side of the PCB 202. Each corresponding pair of contact pads 206, 208 can be electrically connected through, for example, a conductive via 210.

In the example stage of FIGS. 16A and 17A, a group of contact pads 206 on the first side of the PCB 202 can become the contact pads 184 in the example of FIG. 14. Similarly, the corresponding group of contact pads 208 on the second side of the PCB 202 can become the contact pads 188 in the example of FIG. 14.

Referring to FIGS. 16B and 17B, solder material 212 can be applied on the contact pads 206 of the first side of the PCB 202. Such solder material can be applied by, for example, solder printing.

Figure 16C:
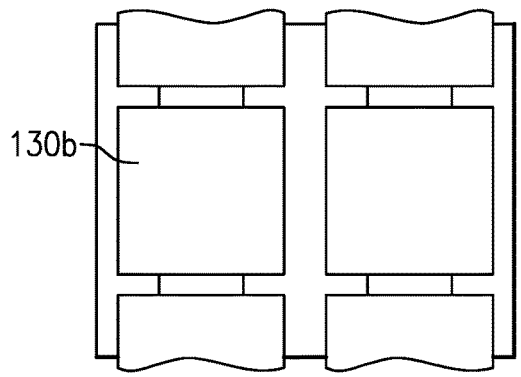
Figure 17C:
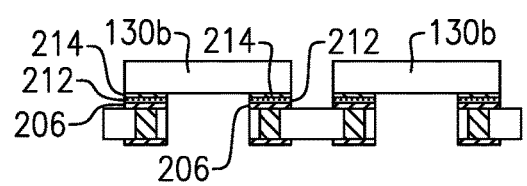

Referring to FIGS. 16C and 17C, a plurality of upper WLP devices 130b can be positioned and mounted to their corresponding sets of contact pads 206 on the first side of the PCB 202. Such positioning of the upper WLP devices 130b can be achieved by, for example, pick-and-place techniques. Such mounting of the upper WLP devices can be achieved by, for example, a reflow technique so as to form solder joints between the corresponding contact pads 206 on the first side of the PCB 202 and contact pads 214 on the upper WLP devices 130b.

Figure 16D:
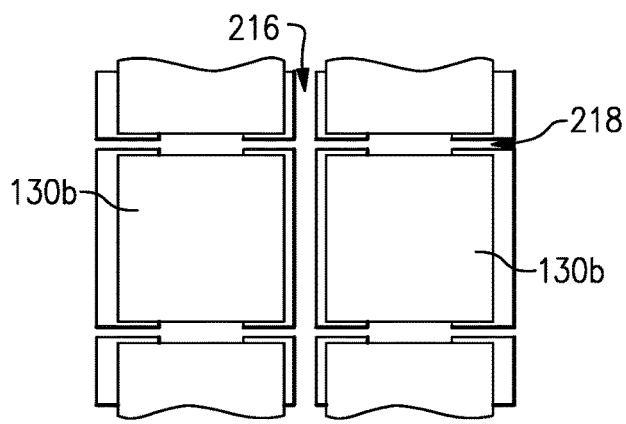
Figure 17D:
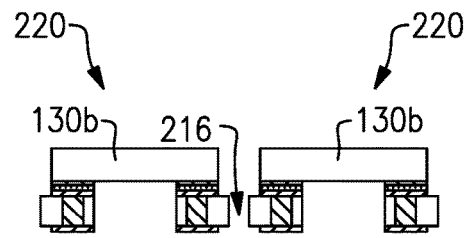

Referring to FIGS. 16D and 17D, an array of upper WLP devices mounted on the PCB 202 in the foregoing manner can be singulated so as to yield a plurality of individual assemblies 220. Such singulation can be achieved along cut paths 216 and 218, utilizing, for example, cutting, sawing, etc. As shown in FIG. 17D, portions of the PCB 202 adjacent to the cut paths 216 become the interposer structures for the corresponding assemblies 220.

FIGS. 18A-18E show an example of how an assembly 220 (of an upper WLP device and corresponding interposer structure) can be combined with a lower WLP device so as to yield a stacked duplexer configuration. Such an assembly 220 can be fabricated as described in reference to FIGS. 15-17.

Figure 18A:
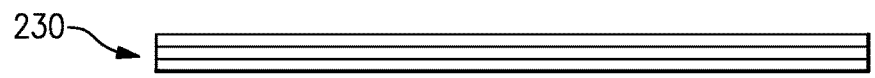
FIGS. 18A-18E show an example assembly, in accordance with some embodiments of the present disclosure.

Referring to FIG. 18A, a packaging substrate 230 such as a PCB can be formed or provided. Although not shown in FIG. 18A, such a packaging substrate can include a plurality of contact pads.

Figure 18B:
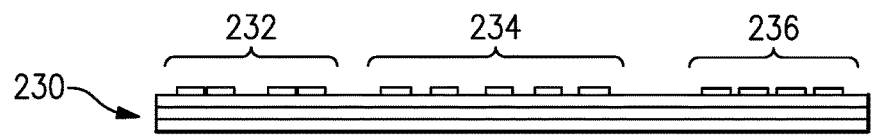

Referring to FIG. 18B, a plurality of solder features can be formed on the corresponding contact pads of the packaging substrate 230. Such solder features can be formed by, for example, screen printing of solder material and flux. In the example of FIG. 18B, a group of solder features indicated as 232 can be utilized for mounting of one or more SMT devices. A group of solder features indicated as 234 can be utilized for mounting of a lower WLP device, as well as an assembly 220 (of an upper WLP device and corresponding interposer structure) described in reference to FIGS. 15-17. A group of solder features indicated as 236 can be utilized for mounting of another component such as a die.

Figure 18C:
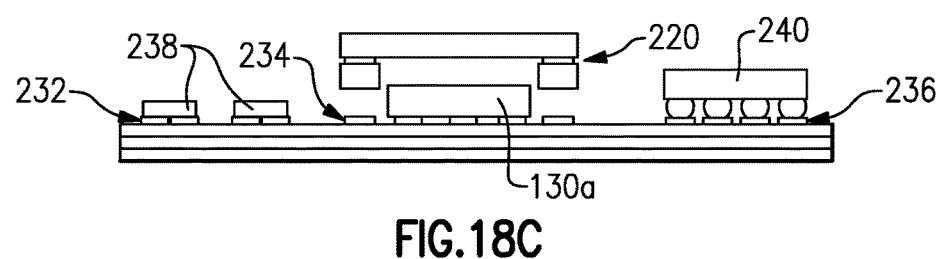

Referring to FIG. 18C, a plurality of SMT devices 238 are shown to be mounted on the packaging substrate through the solder features 232. A lower WLP device 130a is shown to be mounted on the packaging substrate through a portion of the solder features 234. An assembly 220 (of an upper WLP device and corresponding interposer structure), described in reference to FIGS. 15-17, is shown to be mounted on the packaging substrate through the remaining portion of the solder features 234. In some embodiments, some or all of the foregoing mounting and soldering of various parts on the packaging substrate can be achieved by pick-and-place operations and reflow methods.

Figure 18D:
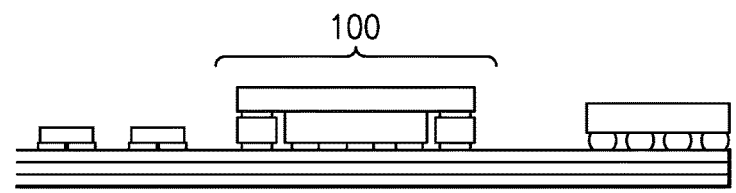

As described herein, such mounting of the assembly 220 results in the upper WLP device to be positioned over the lower WLP device 130a in a stacked manner. FIG. 18D shows such a configuration, in which a stacked duplexer is indicated as 100.

Figure 18E:
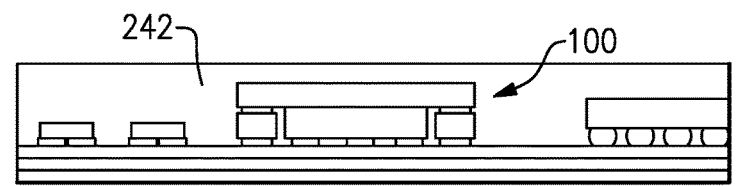

Referring to FIG. 18E, an overmold structure 242 can be formed over the packaging substrate so as to encapsulate some or all of the components mounted on the packaging substrate. In the example shown, such an overmold structure can encapsulate the stacked duplexer 100.

In the example of FIGS. 18A-18E, various stages of fabrication are shown for a single packaged module. It will be understood that in some embodiments, some or all of the various steps in FIGS. 18A-18E can be implemented for an array of such modules in a panel format. For example, various stages up to and including the overmold formation of FIG. 18E can be achieved in such a panel format. Then, the array of overmolded modules can be singulated into individual units such as the example unit of FIG. 18E.

As described herein, stacking of two or more WLP devices provides a significant reduction in footprint area needed on a circuit board to implement functionalities associated with such WLP devices. However, the stacking itself can result in the overall height of the stacked assembly being greater than the height of one or the WLP devices.

Figure 19:
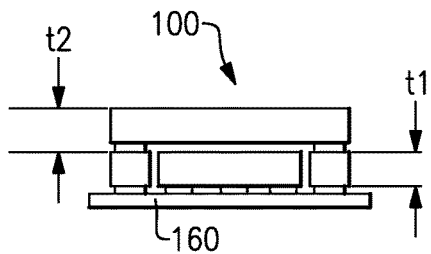
FIG. 19 shows an example side view of a duplexer, in accordance with some embodiments of the present disclosure.

FIG. 19 shows a side view of a stacked duplexer 100 similar to the example described in reference to FIGS. 14-18. In FIG. 19, the height of the lower WLP device is indicated as t1, and the additional height resulting from the upper WLP device being positioned over the lower WLP device is indicated as t2. In some embodiments, either or both of such heights associated with the thicknesses of the two WLP devices and the offset between the two WLP devices can be selected so as to yield an overall height that is within some packaging specification.

Figure 20:
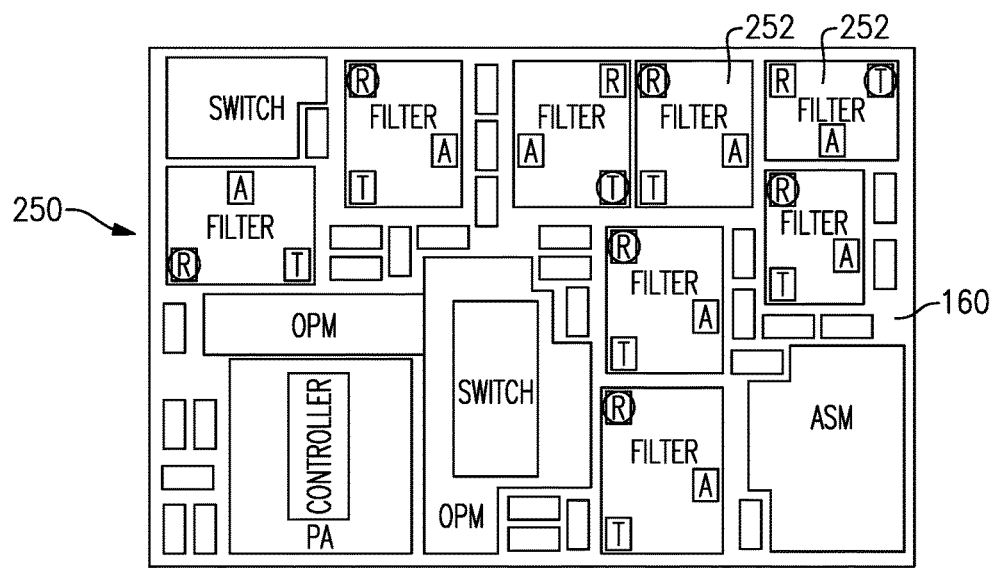
FIG. 20 depicts an example front-end module (FEM), in accordance with some embodiments of the present disclosure.
Figure 21:
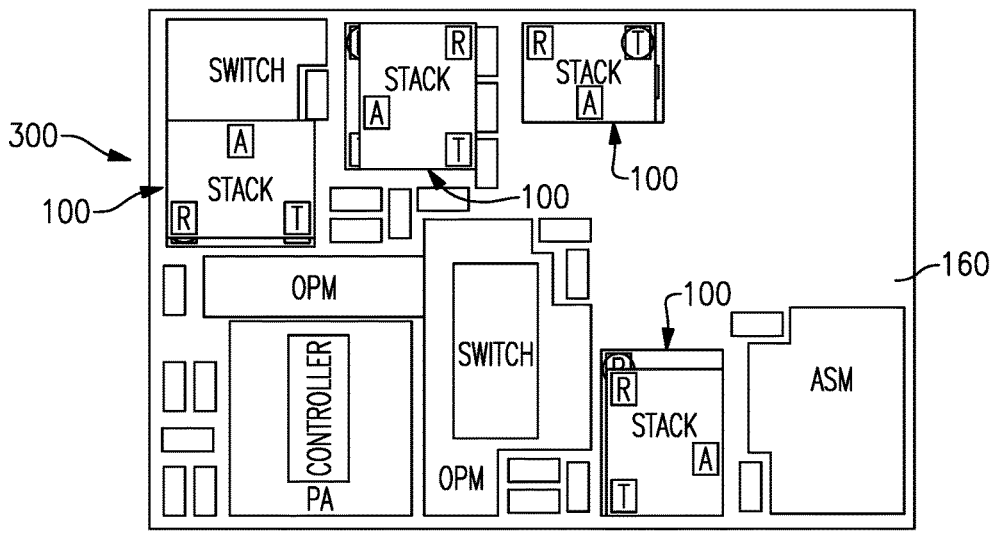
FIG. 21 depicts an example front-end module (FEM), in accordance with some embodiments of the present disclosure.

As described herein, stacking of devices such as WLP devices can result in significant reduction in lateral area needed to implement functionalities associated with such devices. FIGS. 20 and 21 show how significant such reduction in area can be. FIG. 20 depicts an example front-end module (FEM) 250 configured with multi-band capability. Eight filter devices 252 are shown to be mounted on a packaging substrate 160, among other components such as a switch die, a power amplifier (PA) die, one or more matching networks (OPM), an antenna switch module (ASM), and various SMT passive devices. As one can see, the area occupied by the filter devices 252 is a significant portion of the total area available on the packaging substrate 160.

FIG. 21 depicts a front-end module (FEM) 300 configured with multi-band capability, and having similar lateral dimensions as the example FEM 250 of FIG. 20. Eight filter devices 252 are shown to be implemented as four stacked filter devices 100 having one or more features as described herein. As one can see, the area on the packaging substrate occupied by the stacked filter devices 100 is significantly less than the corresponding area utilized for filtering functionality in the example of FIG. 20.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 22:
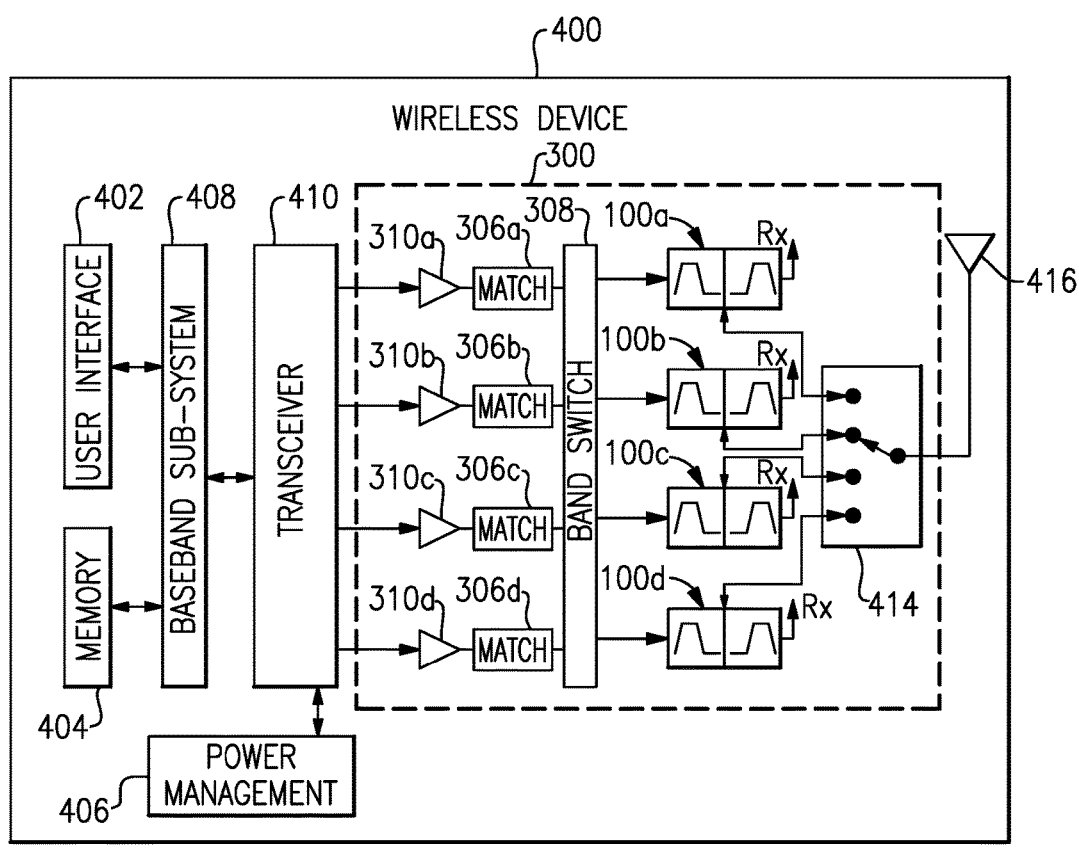
FIG. 22 depicts an example wireless device, in accordance with some embodiments of the present disclosure.

FIG. 22 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 22, power amplifiers (PAs) 310a-310d can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 310a-310d are shown to be matched (via respective match circuits 306a-306d) and routed to an antenna 416 through a band selection switch 308, their respective duplexers 100a-100d and an antenna switch 414. In some embodiments, each of the duplexers 100a-100d can allow transmit and receive operations to be performed simultaneously using a common antenna (e.g., 416). In FIG. 22, received signals are shown to be routed to "Rx" paths (not shown) that can include, for example, a low-noise amplifier (LNA).

In some embodiments, some or all of the duplexers 100a-100d can have a stacked configuration as described herein.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |

TABLE 1-continued

| Band | Mode | Tx Frequency Range (MHz) | Rx Frequency Range (MHz) |
|---|---|---|---|
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An assembly comprising:
   a first wafer-level packaging (WLP) device having a radio-frequency (RF) shield; and
   a second WLP device having an RF shield, the second WLP device positioned over the first WLP device such that the RF shield of the second WLP device is electrically connected to the RF shield of the first WLP device.

2. The assembly of claim 1 wherein the first WLP device includes a first RF filter, and the second WLP device includes a second RF filter.

3. The assembly of claim 2 wherein each of the first and second RF filters includes a grounding contact pad, at least one input contact pad, and at least one output contact pad.

4. The assembly of claim 3 wherein the RF shield of each of the first and second RF filters includes a conformal coating of conductive material.

5. The assembly of claim 4 wherein the conformal coating of each RF filter is electrically connected to the corresponding grounding contact pad.

6. The assembly of claim 5 wherein the second RF filter is in an inverted orientation such that the conformal coating of the RF second filter is in electrical contact with the conformal coating of the first RF filter.

7. The assembly of claim 6 wherein the conformal coating of the second RF filter is electrically connectable to an external ground node through the grounding contact pad of the first RF filter.

8. The assembly of claim 5 wherein the first RF filter has a first lateral dimension and the second RF filter has a second lateral dimension that is greater than the first lateral dimension such that each of a plurality of edges of the second RF filter forms an overhang over a corresponding edge of the first RF filter.

9. The assembly of claim 8 wherein the second RF filter is in an upright orientation, and some or all of the grounding contact pad, the at least one input contact pad, and the at least one output contact pad are located at the overhanging edges.

10. The assembly of claim 9 further comprising a plurality of mounting structures configured to allow mounting of the second RF filter to a packaging substrate at locations that are laterally offset beyond the corresponding edges of the first RF filter.

11. The assembly of claim 10 wherein at least some of the mounting structures is configured to provide one or more electrical connections between the second RF filter and the packaging substrate.

12. The assembly of claim 11 wherein the one or more electrical connections between the second RF filter and the packaging substrate includes a grounding connection between the grounding contact pad of the second RF filter and a ground on the packaging substrate.

13. The assembly of claim 12 wherein the mounting structures include a printed circuit board (PCB) implemented on each of two opposing sides of the first RF filter, the PCB having a thickness selected to allow the second RF filter to be positioned over the first RF filter.

14. The assembly of claim 12 wherein the mounting structures include a ball-grid array (BGA) implemented on each of two opposing sides of the first RF filter, the BGA dimensioned to allow the second RF filter to be positioned over the first RF filter.

15. The assembly of claim 12 wherein the mounting structures include a ball-grid array (BGA) and a printed circuit board (PCB) implemented on each of two opposing sides of the first RF filter, the BGA and the PCB dimensioned to allow the second RF filter to be positioned over the first RF filter.

16. The assembly of claim 12 wherein the mounting structures include an interposer structure implemented on each of two opposing sides of the first RF filter, the interposer structure dimensioned to allow the second RF filter to be positioned over the first RF filter.

17. The assembly of claim 2 wherein the first RF filter is configured to provide receive (RX) filtering functionality for one or more RX frequency bands.

18. The assembly of claim 17 wherein the second RF filter is configured to provide transmit (TX) filtering functionality for one or more TX frequency bands.

19. The assembly of claim 18 wherein the first and second RF filters are configured to provide duplexer functionality for the corresponding one or more frequency bands.

20. A radio-frequency (RF) module comprising:
a packaging substrate configured to receive a plurality of components; and
a stacked assembly implemented on the packaging substrate, the stacked assembly including a first wafer-level packaging (WLP) device having a radio-frequency (RF) shield, the stacked assembly further including a second WLP device having an RF shield, the second WLP device positioned over the first WLP device such that the RF shield of the second WLP device is electrically connected to the RF shield of the first WLP device.

* * * * *